(12) United States Patent
Leobandung

(10) Patent No.: US 10,177,047 B2
(45) Date of Patent: Jan. 8, 2019

(54) TRENCH GATE FIRST CMOS

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/446,612

(22) Filed: Mar. 1, 2017

(65) Prior Publication Data
US 2018/0254220 A1 Sep. 6, 2018

(51) Int. Cl.
*H01L 29/78* (2006.01)
*H01L 27/12* (2006.01)
*H01L 21/84* (2006.01)
*H01L 21/768* (2006.01)
*H01L 21/306* (2006.01)
*H01L 21/265* (2006.01)
*H01L 21/324* (2006.01)
*H01L 29/66* (2006.01)

(52) U.S. Cl.
CPC .......... *H01L 21/845* (2013.01); *H01L 21/265* (2013.01); *H01L 21/30604* (2013.01); *H01L 21/324* (2013.01); *H01L 21/76895* (2013.01); *H01L 27/1211* (2013.01); *H01L 29/6656* (2013.01); *H01L 29/66795* (2013.01); *H01L 29/785* (2013.01)

(58) Field of Classification Search
CPC ............ H01L 29/66795; H01L 29/785; H01L 29/66545; H01L 29/0649; H01L 29/41791; H01L 21/845
See application file for complete search history.

(56) References Cited

U.S. PATENT DOCUMENTS

| | | | | |
|---|---|---|---|---|
| 8,901,665 | B2* | 12/2014 | Kelly | H01L 29/66795 257/288 |
| 9,362,181 | B1* | 6/2016 | Xie | H01L 21/823878 |
| 9,397,003 | B1* | 7/2016 | Niimi | H01L 21/823418 |
| 9,431,486 | B1* | 8/2016 | Ok | H01L 29/1054 |
| 9,536,979 | B2* | 1/2017 | Basker | H01L 29/66545 |
| 2006/0189043 | A1* | 8/2006 | Schulz | H01L 29/42384 438/142 |
| 2016/0343734 | A1* | 11/2016 | Doris | H01L 27/1211 |
| 2016/0351566 | A1* | 12/2016 | Niimi | H01L 21/823418 |
| 2017/0092735 | A1* | 3/2017 | Hashemi | H01L 29/6656 |
| 2017/0170300 | A1* | 6/2017 | Chang | H01L 29/66795 |

* cited by examiner

*Primary Examiner* — Joseph C Nicely
*Assistant Examiner* — David Goodwin
(74) *Attorney, Agent, or Firm* — Scully, Scott, Murphy & Presser, P.C.; L. Jeffrey Kelly, Esq.

(57) ABSTRACT

After forming an interlevel dielectric (ILD) layer over a semiconductor material portion located on a substrate, a gate trench is formed extending through the ILD layer to expose a channel region of the semiconductor material portion. A gate structure is then formed within the gate trench. Epitaxial semiconductor regions are subsequently formed within source/drain contact openings formed on opposite sides of the gate structure, followed by forming source/drain contact structures on the epitaxial semiconductor regions.

18 Claims, 8 Drawing Sheets

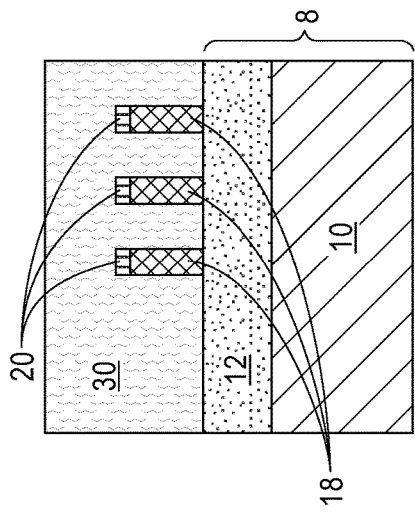
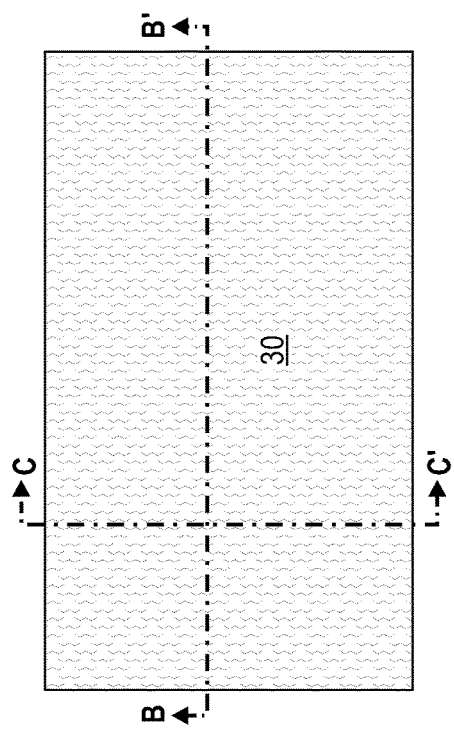
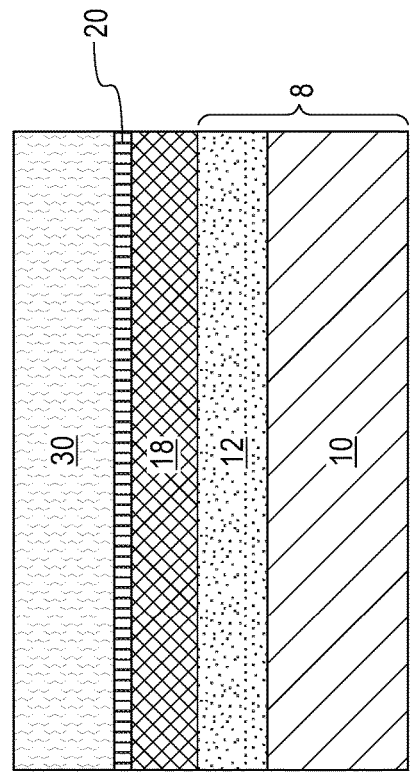

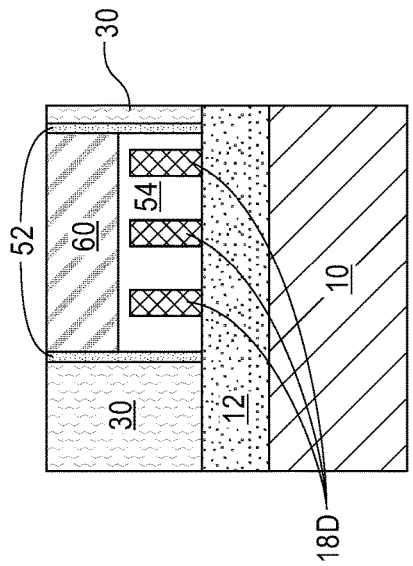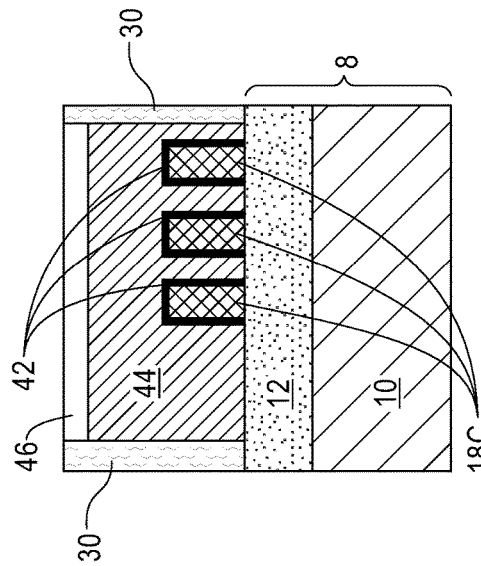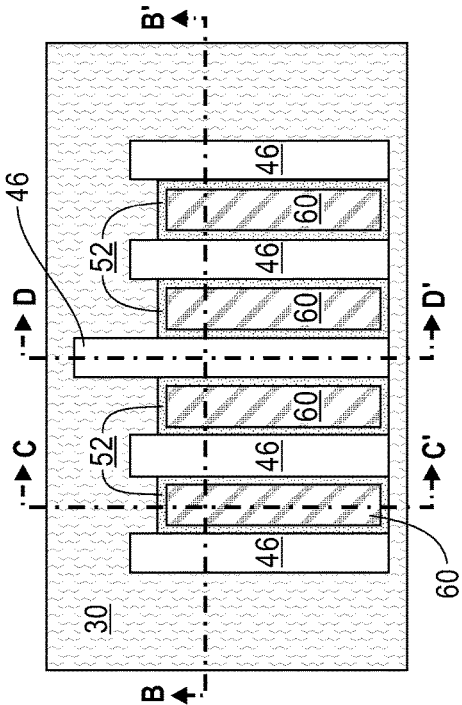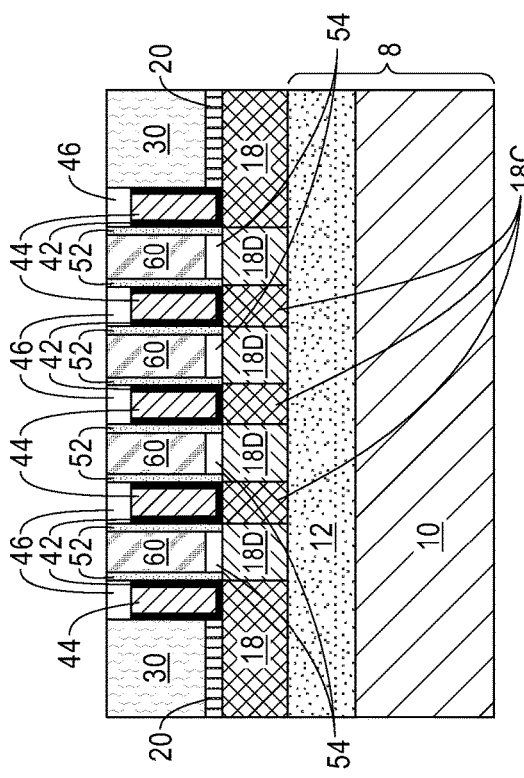
FIG. 8A
FIG. 8B
FIG. 8C
FIG. 8D

United States Patent US 10,177,047 B2

TRENCH GATE FIRST CMOS

BACKGROUND

The present application relates to semiconductor device fabrication, and more particularly to the formation of trench gate structures for field effect transistors (FETs) using a gate first process.

Transistors, such as field effect transistors (FETs), are the basic elements of microelectronics and integrated circuits. A FET typically includes a gate structure overlying a channel region of a semiconductor substrate and a source region and a drain region located in the semiconductor substrate and spaced apart by the channel region. The gate structure includes a gate electrode over a gate dielectric. By applying an appropriate voltage to the gate electrode, the channel region becomes conductive and current is allowed to flow from the source region to the drain region. The gate structure can be formed using a "gate first" process, or a "gate last" process. Gate first refers to a fabrication process in which line-type gate structures are formed by lithographically patterning a gate material stack of a gate dielectric layer and a gate electrode before device activation. Gate last refers to a fabrication process in which line-type sacrificial gate structures are first fabricated by lithography and etching, and then replaced with metal gate structures after device activation.

To reduce power consumption and increase switching speed, integrated circuits are continuously being scaled down. FETs thus tend to get smaller and more densely packed, raising a variety of problems for integration. For example, as the gate pitch continues to shrink, the aspect ratios of the line-type gate or sacrificial gate structures are increased. These free-standing line-type gate or sacrificial gate structures are therefore vulnerable to tilting or collapsing, causing device shorting and reducing device yield. Therefore, a method remains needed to fabricate more robust gate structures, reducing the risk of tilting or collapsing of the gate structures.

SUMMARY

The present application provides a method of forming trench gate structures for field effect transistors (FETs) using a gate first process, thus eliminating the risk of gate tilting and collapsing problems encountered in the prior art processes.

According to one aspect of the present application, a method of forming a semiconductor structure is provided. The method includes forming an interlevel dielectric (ILD) layer over a semiconductor material portion located on a substrate. An entirety of the semiconductor material portion is covered by the ILD layer. A gate trench is then formed extending through the ILD layer. A channel region of the semiconductor material portion is exposed by the gate trench. Next, after forming a gate stack within the gate trench and on a channel region of the semiconductor material portion, source/drain contact openings are formed extending through the ILD layer to expose portions of the semiconductor material portion located on opposite sides of the gate stack. Subsequently, epitaxial semiconductor regions are formed on the exposed portions of the semiconductor material portion, followed by forming source/drain contract structures on the epitaxial semiconductor regions to completely fill the source/drain contact openings.

BRIEF DESCRIPTION OF SEVERAL VIEWS OF THE DRAWINGS

FIG. 2A is a top-down view of the exemplary semiconductor structure of FIGS. 1A-1C after forming an interlevel dielectric (ILD) layer over the substrate and material stacks.

FIG. 2B is a cross-sectional view of the exemplary semiconductor structure of FIG. 2A along line B-B'.

FIG. 2C is a cross-sectional view of the exemplary semiconductor structure of FIG. 2A along line C-C'.

FIG. 8A is a top-down view of the exemplary semiconductor structure of FIGS. 7A-7D after forming source/drain contact structures on top of the epitaxial semiconductor regions.

FIG. 8B is a cross-sectional view of the exemplary semiconductor structure of FIG. 8A along line B-B'.

FIG. 8C is a cross-sectional view of the exemplary semiconductor structure of FIG. 8A along line C-C'.

FIG. 8D is a cross-sectional view of the exemplary semiconductor structure of FIG. 8A along line D-D'.

DETAILED DESCRIPTION

Figure 1C:
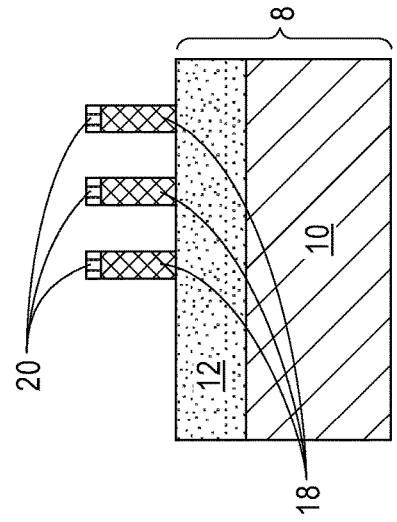
FIG. 1C is a cross-sectional view of the exemplary semiconductor structure of FIG. 1A along line C-C'.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1A:
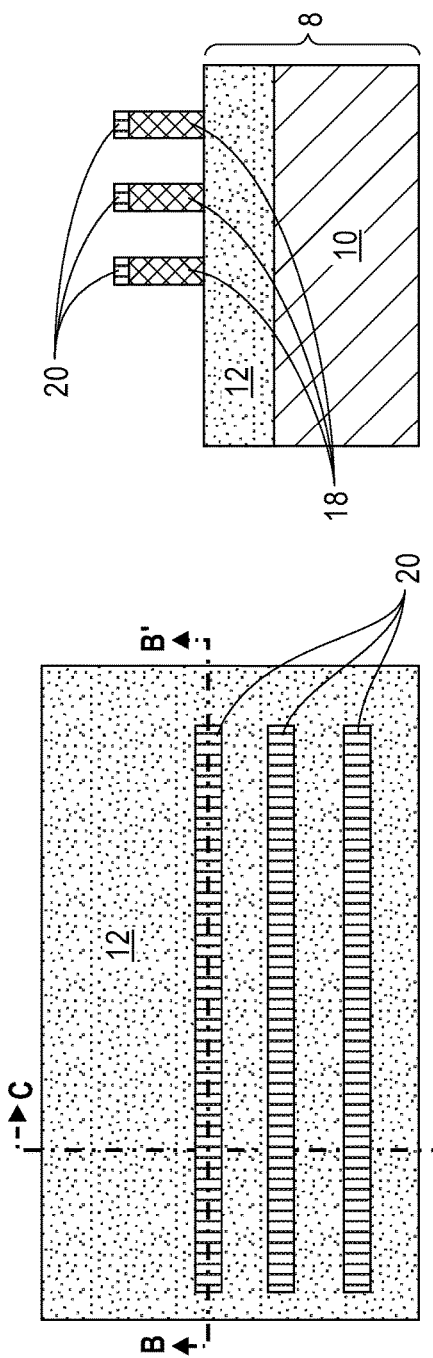
FIG. 1A is a top-down view of an exemplary semiconductor structure after forming material stacks of semiconductor material portions and dielectric caps on a substrate according to an embodiment of the present application.
Figure 1B:
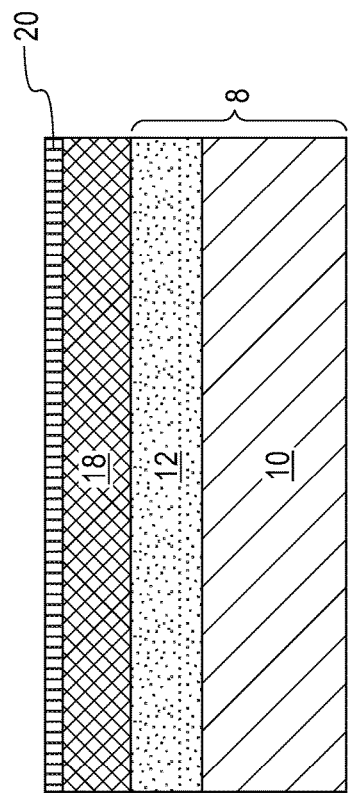
FIG. 1B is a cross-sectional view of the exemplary semiconductor structure of FIG. 1A along line B-B'.
Figure 3C:
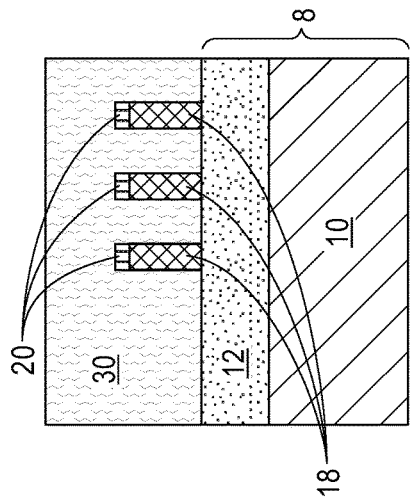
FIG. 3C is a cross-sectional view of the exemplary semiconductor structure of FIG. 3A along line C-C'.
Figure 3D:
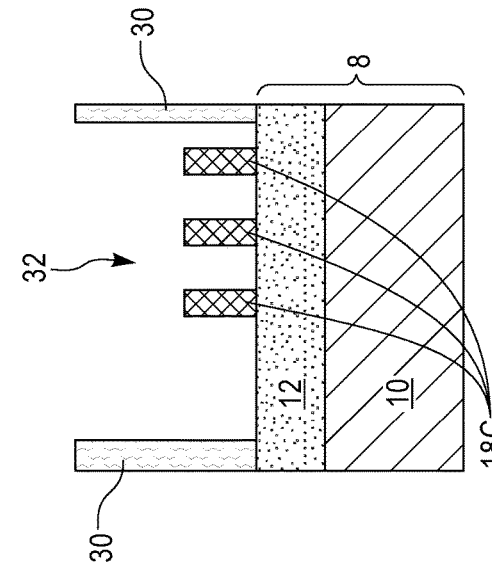
FIG. 3D is a cross-sectional view of the exemplary semiconductor structure of FIG. 3A along line D-D'.
Figure 3A:
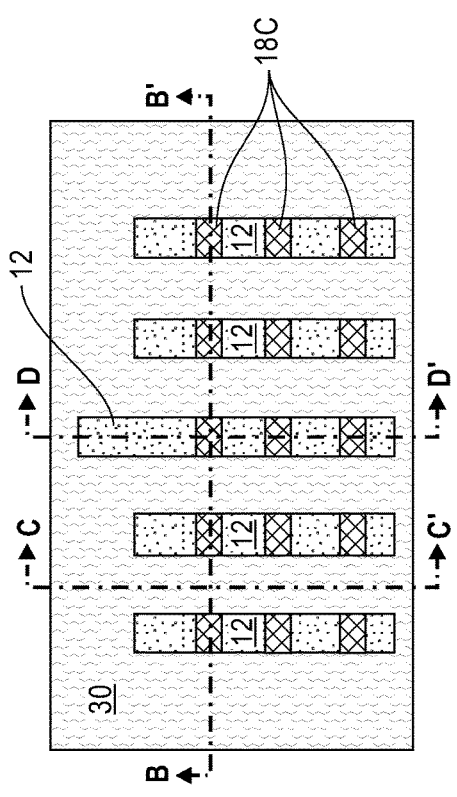
FIG. 3A is a top-down view of the exemplary semiconductor structure of FIGS. 2A-2C after forming a plurality of gate trenches exposing channel portions of the semiconductor material portions.
Figure 3B:
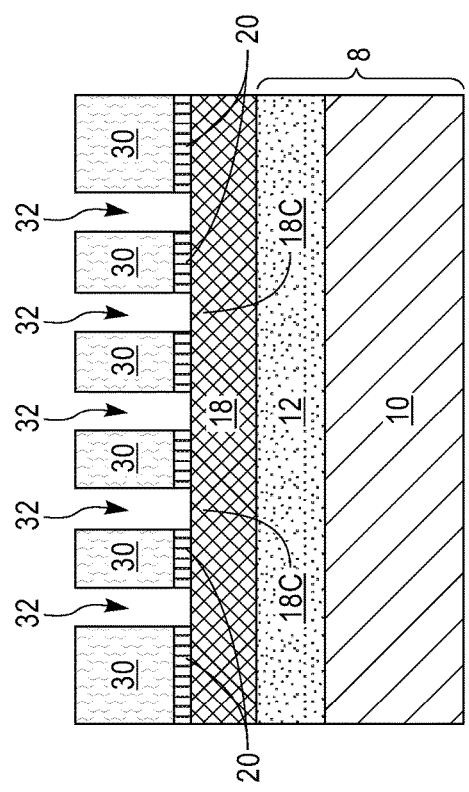
FIG. 3B is a cross-sectional view of the exemplary semiconductor structure of FIG. 3A along line B-B'.
Figure 4C:
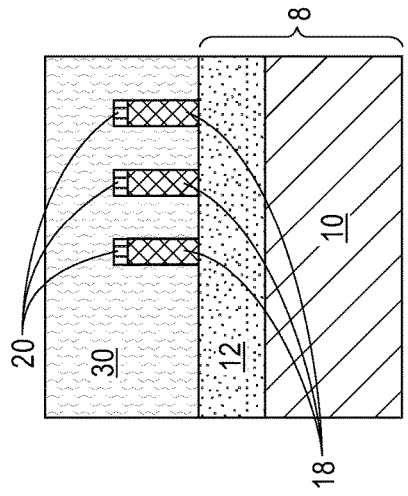
FIG. 4C is a cross-sectional view of the exemplary semiconductor structure of FIG. 4A along line C-C'.
Figure 4D:
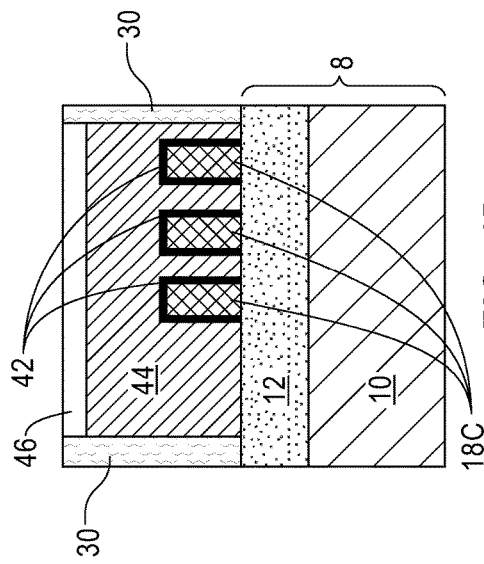
FIG. 4D is a cross-sectional view of the exemplary semiconductor structure of FIG. 4A along line D-D'.
Figure 4A:
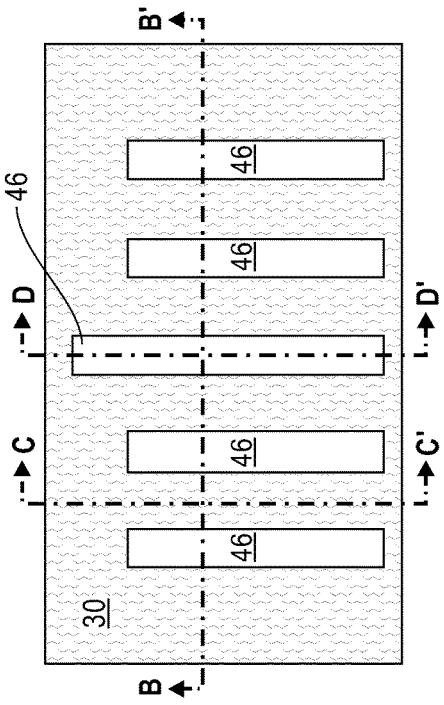
FIG. 4A is a top-down view of the exemplary semiconductor structure of FIGS. 3A-3D after forming gate stacks in the gate trenches.
Figure 4B:
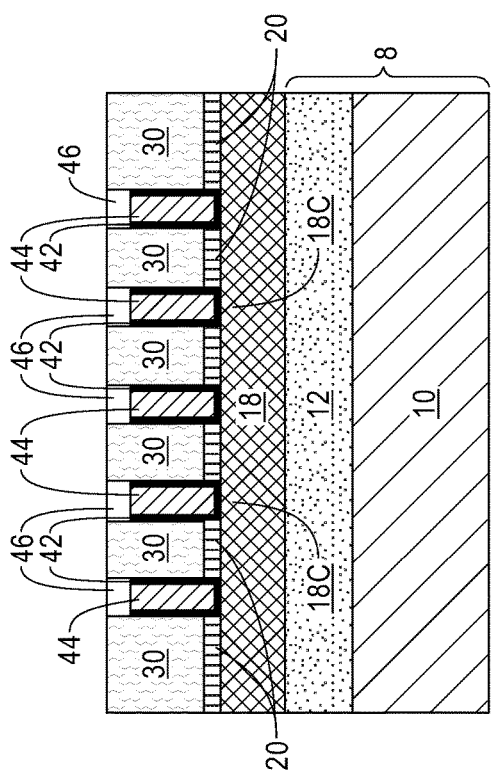
FIG. 4B is a cross-sectional view of the exemplary semiconductor structure of FIG. 4A along line B-B'.
Figure 5A:
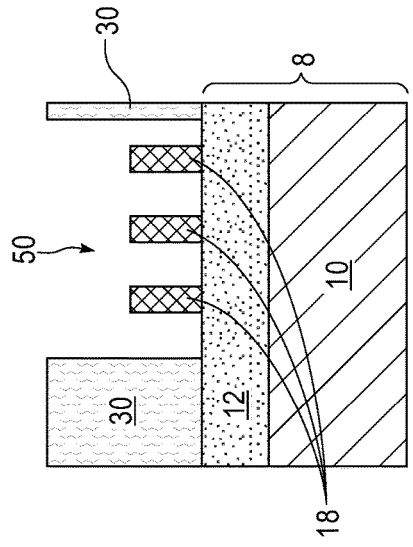
FIG. 5A is a top-down view of the exemplary semiconductor structure of FIGS. 4A-4D after forming source/drain contact openings on opposite sides of the gate stacks.
Figure 5B:
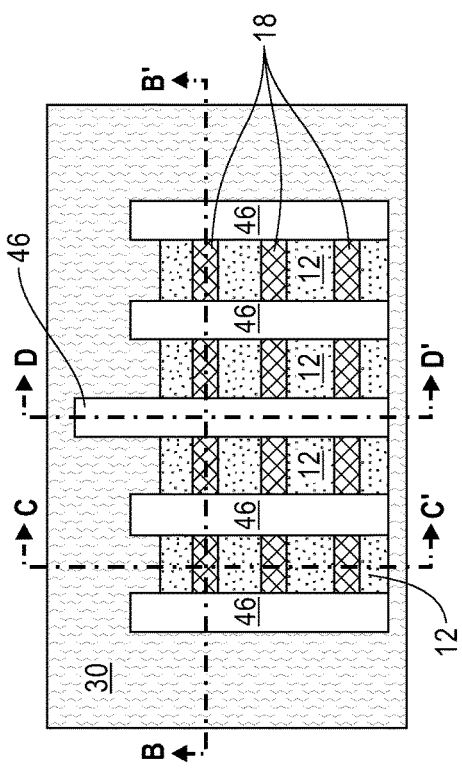
FIG. 5B is a cross-sectional view of the exemplary semiconductor structure of FIG. 5A along line B-B'.
Figure 5C:
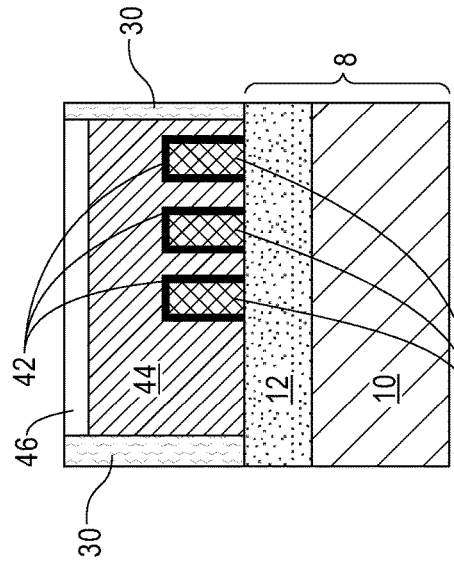
FIG. 5C is a cross-sectional view of the exemplary semiconductor structure of FIG. 5A along line C-C'.
Figure 5D:
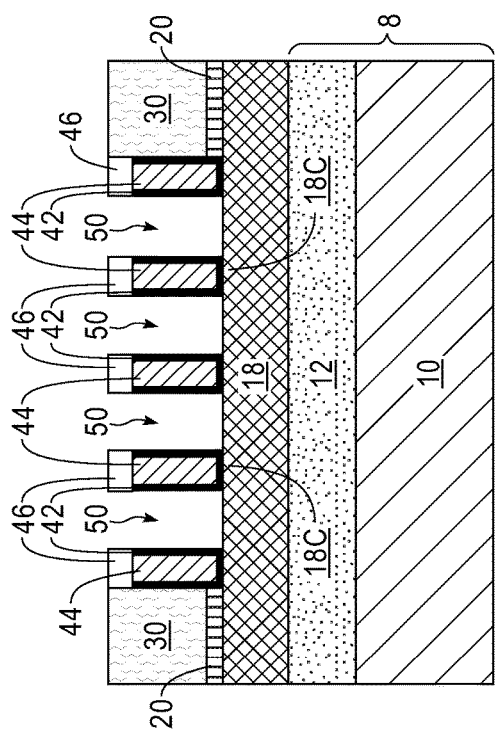
FIG. 5D is a cross-sectional view of the exemplary semiconductor structure of FIG. 5A along line D-D'.
Figure 6A:
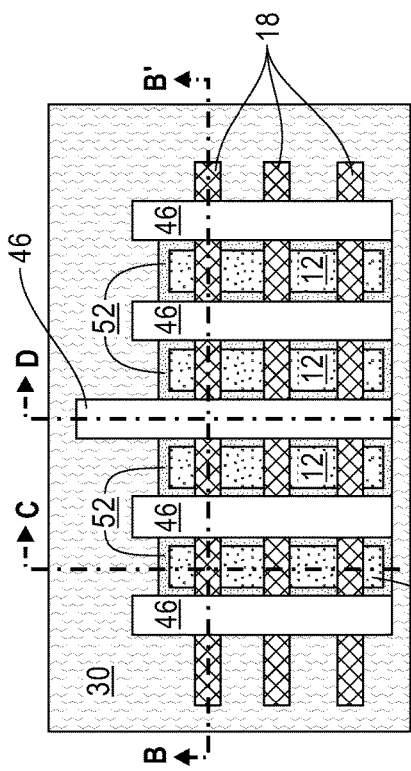
FIG. 6A is a top-down view of the exemplary semiconductor structure of FIGS. 5A-5D after forming sidewall spacers on sidewalls of the source/drain contact openings.
Figure 6B:
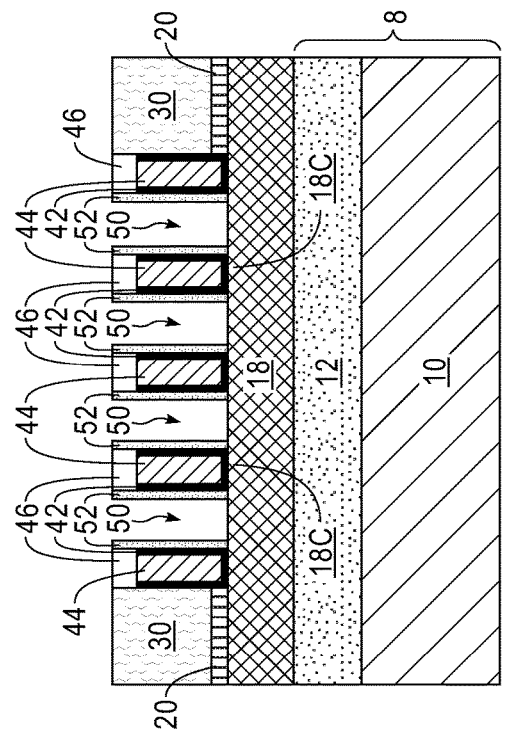
FIG. 6B is a cross-sectional view of the exemplary semiconductor structure of FIG. 6A along line B-B'.
Figure 6C:
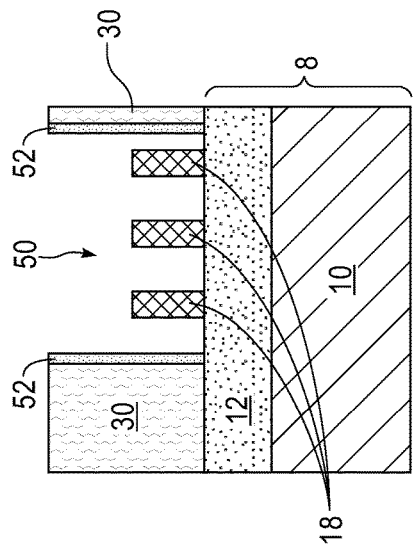
FIG. 6C is a cross-sectional view of the exemplary semiconductor structure of FIG. 6A along line C-C'.
Figure 6D:
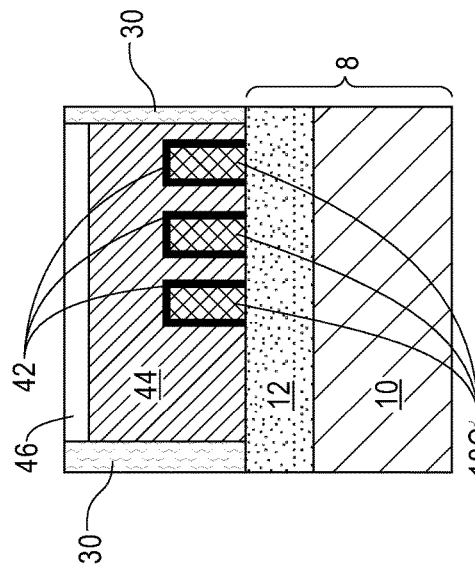
FIG. 6D is a cross-sectional view of the exemplary semiconductor structure of FIG. 6A along line D-D'.
Figure 7C:
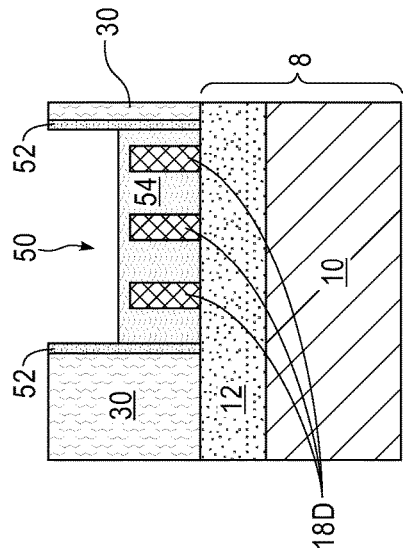
FIG. 7C is a cross-sectional view of the exemplary semiconductor structure of FIG. 7A along line C-C'.
Figure 7D:
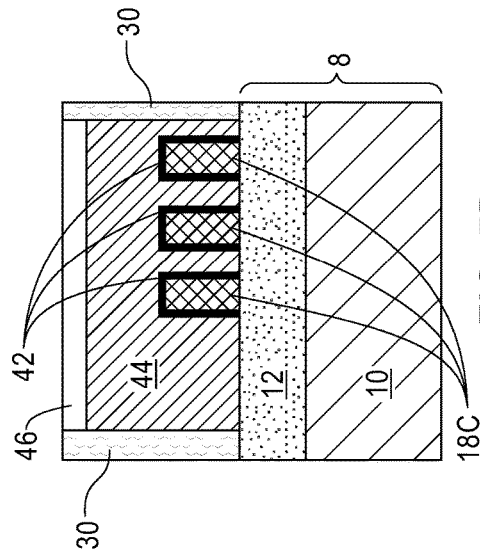
FIG. 7D is a cross-sectional view of the exemplary semiconductor structure of FIG. 7A along line D-D'.
Figure 7A:
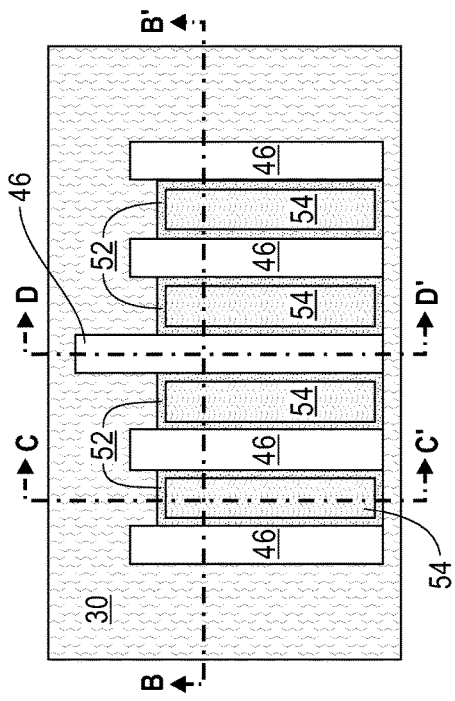
FIG. 7A is a top-down view of the exemplary semiconductor structure of FIGS. 6A-6D after forming epitaxial semiconductor regions within the source/drain contact openings.
Figure 7B:
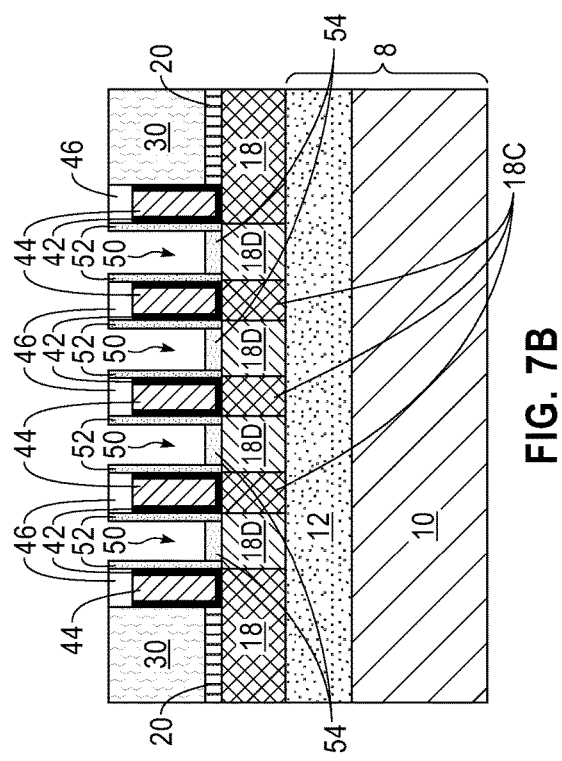
FIG. 7B is a cross-sectional view of the exemplary semiconductor structure of FIG. 7A along line B-B'.

Referring to FIGS. 1A-1C, an exemplary semiconductor structure according to an embodiment of the present application is provided. The semiconductor structure includes a plurality of semiconductor material portions 18 located over a substrate 8. In some embodiments of the present application, the semiconductor structure may also include a plurality of dielectric caps 20 formed on the top of the semiconductor material portions 18. Sidewalls of each dielectric cap 20 are vertically coincident with sidewalls of one of the underlying semiconductor material portions 18. As used herein, two surfaces are vertically coincident if the two surfaces are within a same vertical plane. The dielectric caps 20 are optional and can be omitted in some embodiments of the present application.

In one embodiment, each semiconductor material portion 18 may be a semiconductor fin. The term "semiconductor fin" denotes a contiguous semiconductor structure that extends upward from a surface of a substrate (e.g., substrate 8) and has a pair of vertical sidewalls that are parallel to each other. As used herein, a surface is "vertical" if there exists a vertical plane from which the surface does not deviate by more than three times the root mean square roughness of the surface. The height and width of the semiconductor fins can vary. For example, each semiconductor fin may have a height ranging from 10 nm to 100 nm, and a width ranging from 4 nm to 30 nm. In another embodiment, each semiconductor material portion 18 may be a semiconductor nanowire. In a further embodiment, each semiconductor material portion 18 may be a planar active semiconductor region for forming planar FETs.

In one embodiment, the semiconductor material portions 18 can be formed by providing a semiconductor-on-insulator (SOI) substrate including, from bottom to top, a handle substrate 10, a buried insulator layer 12, and a top semiconductor layer (not shown), and thereafter patterning the top semiconductor layer. In this case, the remaining portions of the top semiconductor layer after patterning constitute the semiconductor material portions 18, and the buried insulator layer 12 and the handle substrate 10 constitute the substrate 8.

The handle substrate 10 may include a semiconductor material, such as, for example, silicon (Si), silicon germanium (SiGe), silicon germanium carbide (SiGeC), silicon carbide (SiC), an III-V compound semiconductor, an II-VI compound semiconductor, or any combinations thereof. Multilayers of semiconductor materials can also be used as the semiconductor material of the handle substrate 10. In one embodiment, the handle substrate 10 is composed of single crystalline silicon. The thickness of the handle substrate 10 can be from 50 µm to 2 mm, although lesser and greater thicknesses can also be employed.

The buried insulator layer 12 that is formed on the handle substrate 10 may include a dielectric material such as silicon dioxide, silicon nitride, silicon oxynitride, or a combination thereof. The buried insulator layer 12 may be formed using a deposition process including, but not limited to, chemical vapor deposition (CVD), plasma enhanced chemical vapor deposition CVD (PECVD), or physical vapor deposition (PVD). Alternatively, the buried insulator layer 12 may be formed by thermal nitridation and/or thermal oxidation of a surface portion of the handle substrate 10. The buried insulator layer 12 may also be formed by implanting oxygen atoms into a bulk semiconductor substrate and thereafter annealing the structure. The thickness of the buried insulator layer 12 can be from 100 nm to 300 nm, although lesser and greater thicknesses can also be employed.

The top semiconductor layer may include any semiconductor material as mentioned above for the handle substrate 10. Exemplary semiconductor materials that can be employed as the top semiconductor layer include, but are not limited to, Si, Ge, SiGe, SiC, and SiGeC, and III/V compound semiconductors such as, for example, InAs, GaAs, and InP. The semiconductor materials of the top semiconductor layer and the handle substrate 10 may be the same or different. In one embodiment, the top semiconductor layer includes single crystalline silicon. The top semiconductor layer may be formed by CVD or PECVD. The thickness of the top semiconductor layer can be from 20 nm to 100 nm, although lesser or greater thicknesses can also be employed. Alternatively, the top semiconductor layer may be formed using a Smart Cut® process where two semiconductor wafers are bonded together with an insulator in between.

The top semiconductor layer can be patterned using lithography and etching to provide the semiconductor material portions 18. For example, a photoresist layer (not shown) can be applied over the top semiconductor layer and lithographically patterned to define a set of areas covered by a patterned photoresist layer. The top semiconductor layer is then patterned by an anisotropic etch using the patterned photoresist layer as an etch mask. In one embodiment, a dry etch such as, for example, reactive ion etch (RIE) can be used. In another embodiment, a wet etch using a chemical etchant can be used. In still a further embodiment, a combination of dry etch and wet etch can be used. After formation of the semiconductor material portions 18, the patterned photoresist layer can be removed, for example, by ashing. Other methods known in the art, such as sidewall image transfer (SIT) or directional self-assembly (DSA), can also be used to pattern the top semiconductor layer of the SOI substrate to provide the semiconductor material portions 18.

In another embodiment, the semiconductor material portions 18 can be formed by providing a bulk semiconductor substrate including a semiconductor material throughout, and by patterning an upper portion of the bulk semiconductor substrate. In this case, the remaining portion of the bulk semiconductor substrate underlying the semiconductor material portions 18 constitutes the substrate 8. The semiconductor material portions 18 are adjoined to the substrate 8 and are comprised of the same semiconductor material as mentioned above for the top semiconductor layer of the SOI substrate.

In some embodiments of the present application and when the dielectric caps 20 are formed, before patterning the top semiconductor layer of the SOI substrate or the upper portion of the bulk semiconductor substrate, a dielectric cap layer (not shown) may be formed on the top semiconductor layer of the SOI substrate, or on the topmost surface of the bulk semiconductor substrate, and subsequently patterned to provide the dielectric caps 20. The dielectric cap layer may include a dielectric material such as, for example, silicon dioxide, silicon nitride, silicon oxynitride, a dielectric metal oxide, or a combination thereof. In one embodiment, the dielectric cap layer is composed of silicon dioxide. The dielectric cap layer may be formed by a deposition process including CVD, PECVD, or PVD, or by a thermal growing process such as thermal oxidation or thermal nitridation. The thickness of the dielectric cap layer can be from 1 nm to 10 nm, although lesser and greater thicknesses can also be employed.

Referring now to FIGS. 2A-2C, there are illustrated the exemplary semiconductor structure of FIGS. 1A-1C after forming an interlevel dielectric (ILD) layer 30 over the buried insulator layer 12 and the semiconductor material portions 18 or the dielectric caps 20, if present. The ILD layer 30 includes a dielectric material that is self-planarizing or can be planarized, for example, by chemical mechanical polishing (CMP). For example, the ILD layer 30 may include a low-k dielectric material having a dielectric constant of about 3.0 or less. Exemplary low-k dielectric materials that can be employed in the present application include, but are not limited to, SiCOH, a porous oxide, organosilicate glass (OSG), and SiBCN. The ILD layer 30 may be formed, for example, by CVD, PECVD, or spin coating. The ILD layer 30 is deposited to a thickness such that an entirety of the top surface of the ILD layer 30 is formed above the top surfaces of the semiconductor material portions 18 or the top surfaces of the dielectric caps 20, if present. In one embodiment, the thickness of the ILD layer 30 can be from 100 nm to 200 nm, although lesser and greater thicknesses can also be employed.

Referring now to FIGS. 3A-3D, there are illustrated the exemplary semiconductor structure of FIGS. 2A-2C after forming gate trenches 32. Each gate trench 32 extends through the ILD layer 30 and the fin caps 20, if present, to expose a channel region 18C of a respective semiconductor material portion 18.

The gate trenches 32 can be formed by lithography and etching. The lithographic process includes forming a photoresist layer (not shown) over the ILD layer 30, exposing the photoresist layer to a desired pattern of radiation and developing the exposed photoresist layer utilizing a conventional resist developer. An anisotropic etch is then performed to remove portions of the ILD layer 30 and the dielectric caps 20, if present, that are not covered by the patterned photoresist layer. The anisotropic etch can be a dry etch, such as, for example, RIE or a wet chemical etch that removes the dielectric material(s) of the ILD layer 30 and the dielectric caps 20, if present, selective to the semiconductor material of the semiconductor material portions 18. After formation of gate trenches 32, the patterned photoresist layer can be removed, for example, by ashing.

Referring now to FIGS. 4A-4D, there are illustrated the exemplary semiconductor structure of FIGS. 3A-3D after forming a gate stack within each gate trench 32. In some embodiments, each gate stack straddles a channel region 18C of each semiconductor material portion 18. By "straddles" it is meant that a gate structure is formed atop and along sidewalls of a channel region 18C of each semiconductor material portion 18. Each gate stack includes a gate dielectric 42 present on sidewalls and a bottom surface of one of the gate trenches 32, a gate electrode 44 present on the gate dielectric 42, and a gate cap 46 present on topmost surfaces of the gate dielectric 42 and the gate electrode 44.

The gate dielectric 42 may include a high-k dielectric material having a dielectric constant greater than silicon dioxide. Exemplary high-k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In one embodiment, the gate dielectric 42 includes $HfO_2$. In some embodiments, the gate dielectric 42 may have a multilayer structure comprising different gate dielectric materials, e.g. silicon dioxide, and a high-k gate dielectric material can be formed. The thickness of the gate dielectric 42 can be from 1 nm to 10 nm, although lesser and greater thicknesses can also be employed.

The gate electrode 44 may include any conductive metal. Exemplary conductive metals that can be employed in the present application include, but are not limited to, W, Ti, Ta, Al, Ni, Ru, Pd, and Pt. In one embodiment, the gate electrode 44 is comprised of W. In some embodiments of the present application, the gate electrode 44 also contains a work function metal (not shown) such as, for example, TiAlN, TiN, or TaN.

The gate cap 46 may include a dielectric material such as an oxide, a nitride or an oxynitride. In one embodiment, the gate cap 46 is composed of silicon nitride.

The gate stacks (42, 44, 46) can be formed by first depositing a conformal dielectric layer (not shown) on exposed surfaces of the gate trenches 32, the semiconductor material portions 18 and the ILD layer 30 and subsequently forming a gate electrode layer (not shown) on the gate dielectric layer to completely fill the gate trenches 32. Each of the gate dielectric layer and the gate electrode layer can be formed, for example, by CVD, PECVD, PVD, or atomic layer deposition (ALD). After deposition of the gate electrode layer and the gate dielectric layer, a planarization process such as, for example, CMP, may be performed to remove portions of the gate dielectric layer and the gate electrode layer from above the top surface of the ILD layer 30. Subsequently, the remaining portions of the gate electrode layer and the gate dielectric layer are recessed below the top surface of the ILD layer utilizing a dry etch or a wet etch. After recessing, a remaining portion of the gate electrode layer located within each gate trench 32 constitutes the gate electrode 44, and a remaining portion of the gate dielectric layer located within each gate trench 32 constitutes the gate dielectric 42. A void (not shown) is formed above the gate dielectric 42 and the gate electrode 44 in each gate trench 32.

A dielectric material is then deposited over gate dielectric 42 and gate electrode 44 within each gate trench 32 to completely fill the void. The deposition of the dielectric material can be performed utilizing, for example, CVD or PECVD. The deposited dielectric material is then planarized, for example, by CMP using the top surface of the ILD layer 30 as a polishing stop to form the gate cap 46. Each gate cap 46 thus can have a top surface coplanar with the top surface of the ILD layer 30.

In the present application, the gate stacks (42, 44, 46) are formed by depositing gate material components (i.e., gate dielectric, gate electrode, and gate cap) within gate trenches 32 formed in a ILD layer 30, thus are laterally supported by the ILD layer 30. The risk of tilting or collapsing of the gate stacks (42, 44, 46) is completely prevented.

Referring now to FIGS. 5A-5D, there are illustrated the exemplary semiconductor structure of FIGS. 4A-4D after forming source/drain contact openings 50 that extend through the ILD layer 30 and the dielectric caps 20, if present. The source/drain contact openings 50 expose sidewalls of the gate stacks (42, 44, 46) and portions of the semiconductor material portions 18 located between the gate stacks (42, 44, 46). The source/drain contact openings 50 can be formed by applying a photoresist layer (not shown) over the ILD layer 30 and the gate caps 46 and then lithographically patterning the photoresist layer to form openings therein. The openings expose portions of the ILD layer 30 located between the gate stacks (42, 44, 46). The physically exposed portions of the ILD layer 30 and underlying portions of dielectric caps 20, if present, are subsequently removed by an etch. The etch can be a dry etch or a wet etch that removes the dielectric material(s) that provide the ILD layer 30 and the dielectric caps 20, if present, selective to the dielectric materials that provides the gate caps 46 and the gate dielectrics 44 as well as the semiconductor material that provides the semiconductor material portions 18. In one embodiment, multiple RIE may be performed. After forming the source/drain contact openings 40, the patterned photoresist layer can be removed, for example, by ashing.

Referring now to FIGS. 6A-6D, there are illustrated the exemplary semiconductor structure of FIGS. 5A-5D after forming a sidewall spacer 52 on sidewalls of each source/drain contact opening 50 (i.e., sidewalls of each gate stack (42, 44, 46)). Each sidewall spacer 52 may include a dielectric material such as, for example, an oxide, a nitride, an oxynitride, or any combination thereof. In one embodiment, each sidewall spacer 52 is composed of silicon nitride. The sidewall spacers 52 can be formed by conformally depositing a dielectric material on exposed surfaces of the source/drain contact openings 50, the semiconductor material portions 18 and the ILD layer 30 by a conformal deposition process including, for example, CVD, PECVD, PVD, or ALD. Horizontal portions of the deposited dielectric material are subsequently removed, for example, by an anisotropic etch. The anisotropic etch can be a dry etch such as, for example, RIE or a wet etch. The anisotropic etch may be continued until portions of deposited dielectric material present on sidewalls of the exposed portions of the semiconductor portions 18 are completely removed. After etching, remaining vertical portions of the deposited dielectric material present on the sidewall surfaces of each source/drain contract openings 50 constitute the sidewall spacer 52. The width of each sidewall spacer 52, as measured at the base of the sidewall spacer 52 can be from 2 nm to 10 nm, although lesser and greater widths can also be employed.

Referring now to FIGS. 7A-7D, there are illustrated the exemplary semiconductor structure of FIGS. 6A-6D after growing epitaxial semiconductor regions 54 from top and sidewall surfaces of physically exposed portions of semiconductor material portions 18 that are not covered by the sidewall spacers 52, the gate stacks (42, 44, 46) and the ILD layer 30. The epitaxial semiconductor regions 54 may include any semiconductor material as mentioned above for the semiconductor material portions 18. In one embodiment of the present application, the epitaxial semiconductor regions 54 include a semiconductor material that is the same as the semiconductor material that provides the semiconductor material portions 18. For example, both epitaxial semiconductor regions 54 and semiconductor material portions 18 may be composed of silicon. In another embodiment of the present application, the epitaxial semiconductor regions 54 include a semiconductor material different from the semiconductor material that provides the semiconductor material portions 18. For example, the epitaxial semiconductor regions 54 may be composed of SiGe and the semiconductor material portions 18 may be composed of silicon.

The epitaxial semiconductor regions 54 also contain p-type or n-type dopants. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The dopant concentration of the epitaxial semiconductor regions 54 can be from $1\times10^{20}$ atoms/cm$^3$ to $1\times10^{22}$ atoms/cm$^3$, although lesser and greater dopant concentration can also be employed.

The epitaxial semiconductor regions 54 may be formed by a selective epitaxial growth process. The selective epitaxial growth process grows the semiconductor material that provides epitaxial semiconductor regions 54 only from the semiconductor surfaces (i.e., exposed top and sidewall surfaces of the semiconductor material portions 18), but not from dielectric surfaces, such as surfaces of the ILD layer 30, the gate caps 46, and the sidewall spacers 52. Examples of various epitaxial growth processes that are suitable for use in forming the epitaxial semiconductor regions 54 include, but are not limited to, molecular beam epitaxy (MBE) and metal-organic chemical vapor deposition (MOCVD). The dopants can be provided during selective epitaxial growth process by in-situ doping, or after selective epitaxial growth process by ion implantation or gas phase doping. In one embodiment and as shown, the selective epitaxial growth process can be continued until the epitaxial semiconductor regions 54 merge neighboring semiconductor material portions 18.

The dopants in the epitaxial semiconductor regions 54 can be activated for example, by a rapid thermal anneal process. In some embodiments of the present application, the annealing may result in a diffusion of dopants from the epitaxial semiconductor regions 54 into the portions of the semiconductor material portions 18 underlying the epitaxial semiconductor regions 54. Doped semiconductor regions 18D thus are formed within portions of the semiconductor material portions 18 that are not covered by the gate stacks (42, 44, 46) to laterally surround the channel regions 18C. Collectively, the doped semiconductor region 18D and the epitaxial semiconductor regions 54 constitute source/drain regions for FETs.

Referring now to FIGS. 8A-8D, there are illustrated the exemplary semiconductor structure of FIGS. 7A-7D after forming source/drain contact structures 60 over the epitaxial semiconductor regions 54 to completely fill the source/drain contract openings 50. The source/drain contract structures 60 can be formed by deposition of a conductive material (e.g., tungsten) into the source/drain contract openings 50 and on the top surfaces of the ILD layer 30 and gate caps 46 and by planarization to remove excess portions of the deposited conductive material from above the top surfaces of the ILD layer 30 and the gate caps 46. Optionally, contact liners (not shown) may be formed on the sidewalls the source/drain contact openings 50 and on the top surfaces of the epitaxial semiconductor regions 54 before filling the source/drain contact openings 50 with the conductive material. In one embodiment, the contact liners may include titanium.

While the methods and structures disclosed herein have been particularly shown and described with respect to preferred embodiments thereof, it will be understood by those skilled in the art that the foregoing and other changes in forms and details may be made without departing from the spirit and scope of the present application. It is therefore intended that the methods and structures disclosed herein not be limited to the exact forms and details described and illustrated, but fall within the scope of the appended claims.

What is claimed is:

1. A method of forming a semiconductor structure comprising:
    forming an interlevel dielectric (ILD) layer over a semiconductor material portion located on a substrate, wherein an entirety of the semiconductor material portion is covered by the ILD layer and wherein the semiconductor material portion is a semiconductor fin or a semiconductor nanowire;
    forming a gate trench extending through the ILD layer, wherein a channel region of the semiconductor material portion is exposed by the gate trench;
    forming a gate stack within the gate trench and on the channel region of the semiconductor material portion, wherein the gate stack comprises a gate dielectric and a gate electrode, wherein a topmost surface of the gate dielectric is coplanar with a topmost surface of the gate electrode;
    forming source/drain contact openings extending through the ILD layer to expose portions of the semiconductor material portion located on opposite sides of the gate stack, wherein each of said source/drain contact openings physically exposes an entirety of a vertical sidewall of the gate dielectric of the gate stack;
    forming, after the forming of the gate stack and the source/drain contact openings, a sidewall spacer in each of the source/drain contact openings, wherein the sidewall spacer directly contacts the entirety of the vertical sidewall of the gate dielectric of the gate stack;
    forming epitaxial semiconductor regions on the exposed portions of the semiconductor material portion; and
    forming source/drain contact structures on the epitaxial semiconductor regions to completely fill the source/drain contact openings.

2. The method of claim 1, wherein the sidewall spacer laterally surrounds one of the epitaxial semiconductor regions and one of the source/drain contact structures.

3. The method of claim 1, wherein the forming the sidewall spacer comprises:
    depositing a dielectric material on bottom surfaces and sidewall surfaces of the source/drain contact openings, top surfaces and sidewall surfaces of the exposed portions of the semiconductor material portion located on the opposite sides of the gate stack, and a top surface of the ILD layer;
    removing horizontal portions of the deposited dielectric material; and
    removing vertical portions of the deposited dielectric material present on the sidewall surfaces of the exposed portions of the semiconductor material portion located on the opposite sides of the gate stack.

4. The method of claim 1, further comprising forming the semiconductor material portion, wherein the forming of the semiconductor portion is performed prior to the forming of the interlevel dielectric (ILD) layer over the semiconductor material portion.

5. The method of claim 4, wherein the forming the semiconductor material portion comprises:
    forming a photoresist layer on a top semiconductor layer of a semiconductor-on-insulator substrate; and
    patterning the top semiconductor layer, wherein a remaining portion of the top semiconductor layer constitutes the semiconductor material portion.

6. The method of claim 5, further comprising forming a dielectric cap layer on the top semiconductor layer.

7. The method of claim 6, further comprising patterning the dielectric cap layer to form a dielectric cap on top of the semiconductor material portion, wherein the ILD layer covers the dielectric cap, and wherein the gate trench and the source/drain contact openings extend through the dielectric cap layer.

8. The method of claim 1, wherein the gate stack further comprises a gate cap present on the topmost surface of both the gate dielectric and the gate electrode.

9. The method of claim 8, wherein the forming the gate stack comprises:
    forming a gate dielectric layer on physically exposed surfaces of the gate trench, the channel region of the semiconductor material portion and the ILD layer;
    forming a gate electrode layer on the gate dielectric layer to completely fill the gate trench;
    removing portions of the gate electrode layer and the gate dielectric layer from a top surface of the ILD layer;
    recessing the gate electrode layer and the gate dielectric layer below the top surface of the ILD layer to form the gate dielectric and the gate electrode; and
    filling a void that is formed on the gate dielectric and gate electrode with a dielectric material to form the gate cap.

10. The method of claim 1, wherein the forming the source/drain contact openings is performed by an anisotropic etch.

11. The method of claim 1, wherein the forming the epitaxial semiconductor regions are performed by a selective epitaxial growth.

12. The method of claim 1, wherein the epitaxial semiconductor regions comprise a doped semiconductor material.

13. The method of claim 12, further comprising diffusing dopants from the epitaxial semiconductor regions into the exposed portions of the semiconductor material potion to form doped semiconductor regions within the semiconductor material portion, wherein the doped semiconductor regions laterally surround the channel region.

14. The method of claim 13, wherein the diffusing the dopants is performed by an anneal process.

15. The method of claim 1, wherein topmost surfaces of the source/drain contact structures are coplanar with a topmost surface of the ILD layer and a top surface of the gate cap.

16. The method of claim 1, wherein the substrate comprises a handle substrate and a buried insulator layer overlying the handle substrate, wherein a bottom surface of the semiconductor material portion is in direct contact with the buried insulator layer.

17. The method of claim 1, wherein the ILD layer comprises a low-k dielectric material.

18. A method of forming a semiconductor structure comprising:
   forming an interlevel dielectric (ILD) layer over a planar active region of a semiconductor material layer, wherein an entirety of the planar active region of the semiconductor material layer is covered by the ILD layer;
   forming a gate trench extending through the ILD layer, wherein a channel region of the planar active region of the semiconductor material layer is exposed by the gate trench;
   forming a gate stack within the gate trench and on the channel region of the planar active region of the semiconductor material layer, wherein the gate stack comprises a gate dielectric and a gate electrode, wherein a topmost surface of the gate dielectric is coplanar with a topmost surface of the gate electrode;
   forming source/drain contact openings extending through the ILD layer to expose portions of the planar active region of the semiconductor material layer located on opposite sides of the gate stack, wherein each of said source/drain contact openings physically exposes an entirety of a vertical sidewall of the gate dielectric of the gate stack;
   forming, after the forming of the gate stack and the source/drain contact openings, a sidewall spacer in each of the source/drain contact openings, wherein the sidewall spacer directly contacts the entirety of the vertical sidewall of the gate dielectric of the gate stack;
   forming epitaxial semiconductor regions on the exposed portions of the planar active region of the semiconductor material layer; and
   forming source/drain contact structures on the epitaxial semiconductor regions to completely fill the source/drain contact openings.

\* \* \* \* \*